(12) United States Patent
Hasegawa et al.

(10) Patent No.: US 8,169,722 B2
(45) Date of Patent: May 1, 2012

(54) FLEXIBLE PRINTED CIRCUIT, IMAGE PICKUP DEVICE, AND ELECTRONIC EQUIPMENT

(75) Inventors: Atsushi Hasegawa, Osaka (JP); Takumi Kuwahara, Nara (JP); Manabu Kobayashi, Osaka (JP); Fumio Shinano, Osaka (JP)

(73) Assignee: Panasonic Corporation, Osaka (JP)

( * ) Notice: Subject to any disclaimer, the term of this patent is extended or adjusted under 35 U.S.C. 154(b) by 946 days.

(21) Appl. No.: 12/027,560

(22) Filed: Feb. 7, 2008

(65) Prior Publication Data
US 2008/0186595 A1 Aug. 7, 2008

(30) Foreign Application Priority Data

Feb. 7, 2007 (JP) .................................. 2007-028378
May 11, 2007 (JP) .................................. 2007-126281

(51) Int. Cl.
*G02B 7/02* (2006.01)
(52) U.S. Cl. .......................... 359/811; 359/813; 359/819
(58) Field of Classification Search .................. 359/811, 359/813, 82, 823, 819, 822
See application file for complete search history.

(56) References Cited

U.S. PATENT DOCUMENTS 6,530,792 B2 * 3/2003 Lai et al. ........................ 439/165
2006/0160390 A1 * 7/2006 Miura et al. ................... 439/260

FOREIGN PATENT DOCUMENTS

JP 6-233196 8/1994

* cited by examiner

*Primary Examiner* — Ricky Mack
*Assistant Examiner* — Brandi Thomas
(74) *Attorney, Agent, or Firm* — Hamre, Schumann, Mueller & Larson, P.C.

(57) ABSTRACT

A flexible printed circuit according to the present invention is anchored to a holding member disposed within electronic equipment, and comprises: a main body portion 70 that includes electrical lines; a first connection portion 71 disposed in the main body portion 70 and to which an electric component or another flexible printed circuit is connected; and a first cover portion 72 formed as part of the main body portion 70 and disposed so as to cover the first connection portion. Part of the first cover portion is held by a lens holder 6. According to this configuration, an insulated state can be reliably maintained by using a configuration in which soldered connection portions are covered by part of the FPC and the covering portion is held by the housing.

7 Claims, 16 Drawing Sheets

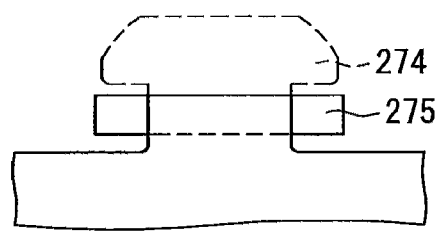 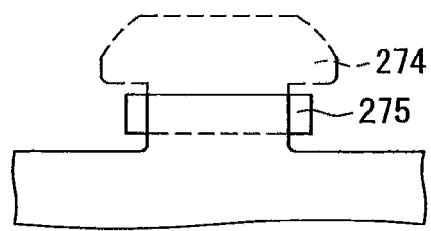
FIG. 17A    FIG. 17B
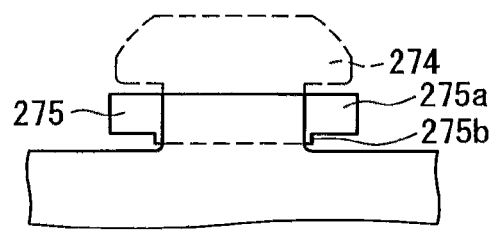
FIG. 18

FLEXIBLE PRINTED CIRCUIT, IMAGE PICKUP DEVICE, AND ELECTRONIC EQUIPMENT

BACKGROUND OF THE INVENTION

1. Field of the Invention

The present invention relates to a flexible printed circuit (referred to as "FPC" hereinafter) in which are formed electric wires capable of transmitting electric signals, and also relates to an image pickup device provided with such an FPC and electronic equipment.

2. Description of Related Art

The miniaturization of digital still cameras has been advancing in recent years. In a miniaturized digital still camera, an image pickup unit provided with a lens, an image sensor, and so on and an electric circuit provided with a microprocessor for signal processing are electrically connected to one another using a highly-flexible FPC. Such a configuration increases the degree of freedom with which various units can be arranged within the digital still camera, thereby contributing to the miniaturization of the camera.

FIG. 19 is a plan view illustrating the configuration of a conventional image pickup unit. As shown in FIG. 19, an image pickup unit 100 includes: a lens holder 101 provided with at least one lens and an image sensor; and an FPC 102 electrically connected to the image sensor, an electric circuit, and so on. Connection portions 102a and 102b, to which other FPCs and electric components are connected through soldering, are formed on the FPC 102. As shown in FIG. 19, the connection portions 102a and 102b are disposed with the soldered connection portions exposed, and thus there is the possibility that the exposed portions will make contact with other electric components and cause a short-circuit. There is a particularly high possibility that the connection portions 102a and 102b will electronically short-circuit with electric components, various members, and so on in a device in which miniaturization is required, such as a digital still camera, because the components and members are packed tightly together within the housing of the device. There is a method that, for example, applies insulating sheets to the connection portions 102a and 102b so as to prevent such electrical short-circuiting. However, such a method is problematic in that it increases the number of components and thus leads to an increase in cost. A means for solving a problem such as this is disclosed in, for example, Patent Document 1 (JP H06(1994)-233196A).

Patent Document 1 discloses a configuration in which an insulation sheet used for electric insulation is formed as part of the FPC, between the electric components that are disposed opposite the FPC and the FPC, when the FPC is bent and fitted into the camera housing.

However, with the configuration disclosed in Patent Document 1, the insulating sheet formed as part of the FPC is not anchored to the camera housing, except for a bent portion. Therefore, there is a problem in that the insulating sheet may move from its proper position (the position in which it insulates other components outside of a cover region from the inside of the cover region) due to shock, vibration, or the like affected on the camera device, leading to short-circuits between the inside of the cover region and the outside thereof.

SUMMARY OF THE INVENTION

Therefore, with the foregoing in mind, it is an object of the present invention to provide a flexible printed circuit that can reliably maintain an insulated state between the inside of a cover region and the outside thereof, using a configuration in which soldered connection portions are covered by part of the FPC. It is another object of the present invention to provide a flexible printed circuit having a cover portion fixed by an easier method. It is still another object of the present invention to provide an image pickup device that includes such a flexible printed circuit.

A flexible printed circuit according to the present invention is anchored to a holding member disposed within electronic equipment, and includes: a main body portion that includes electrical lines; a connection portion which is disposed in the main body portion and to which an electric component or another flexible printed circuit is connected; and a cover portion formed as part of the main body portion and disposed so as to cover the connection portion, wherein part of the cover portion is held by the holding member.

An image pickup device according to the present invention includes at least one lens, and includes: a lens holder that holds the lens; and a flexible printed circuit disposed at the lens holder. Here, the flexible printed circuit includes: a main body portion that includes electrical lines; a connection portion which is disposed in the main body portion and to which an electric component or another flexible printed circuit is electrically connected; and a cover portion formed as part of the main body portion and disposed so as to cover the connection portion, wherein part of the cover portion is held by the lens holder.

Furthermore, electronic equipment according to the present invention includes a flexible printed circuit, wherein the flexible printed circuit includes a main body portion including a connection portion to which an electronic component or another flexible printed circuit is connected electrically, a hole provided in the main body portion, and a cover portion formed as part of the main body portion and disposed so as to be bent at a bent portion and to cover the connection portion, the cover portion includes at least one protrusion in at least one portion, and the cover portion is anchored to the main body portion at the protrusion when the protrusion is inserted in the hole.

According to the present invention, an insulated state can be reliably maintained by allowing the holding member to hold the cover portion in a configuration in which connection portions are covered by part of the FPC.

BRIEF DESCRIPTION OF THE DRAWINGS

FIG. 17A is a plan view illustrating the shape of a hole according to another embodiment.

FIG. 17B is a plan view illustrating the shape of a hole according to another embodiment.

FIG. 18 is a plan view illustrating the shape of a hole according to another embodiment.

DETAILED DESCRIPTION OF THE INVENTION

Hereinafter, the present invention will be described by way of illustrative embodiments with reference to the drawings.

Embodiment 1

[1. Configuration of Image Pickup Device]

Figure 1:
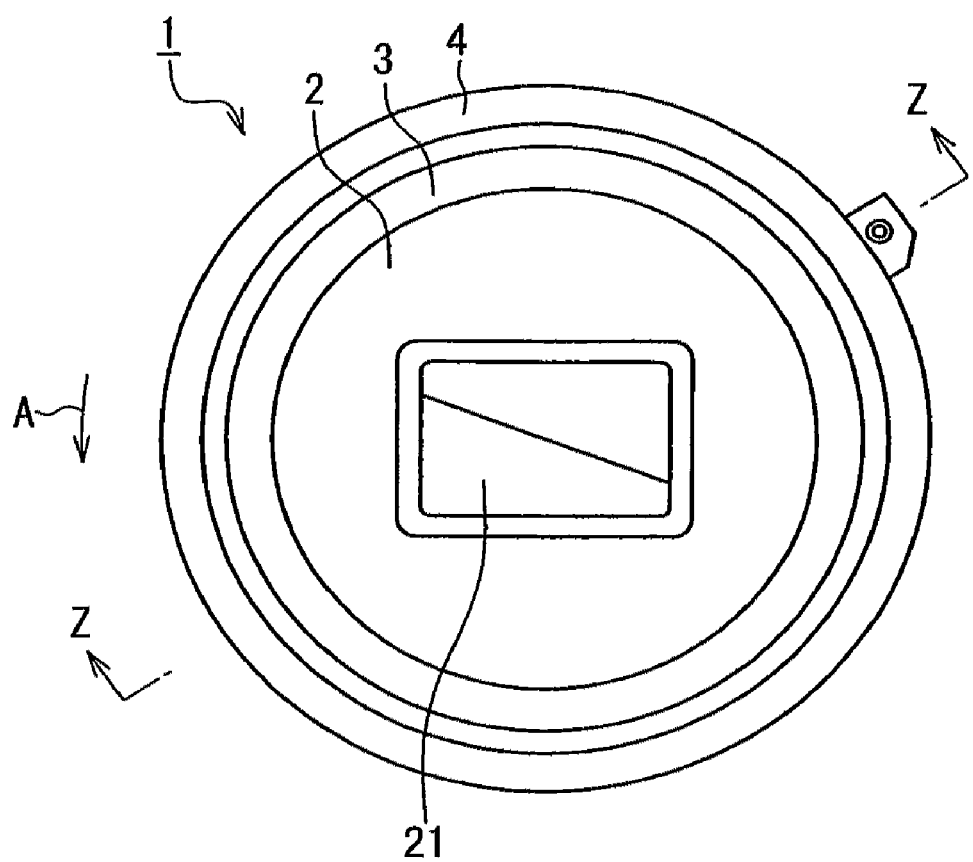
FIG. 1 is a plan view illustrating the configuration of an image pickup unit according to Embodiment 1.
Figure 2:
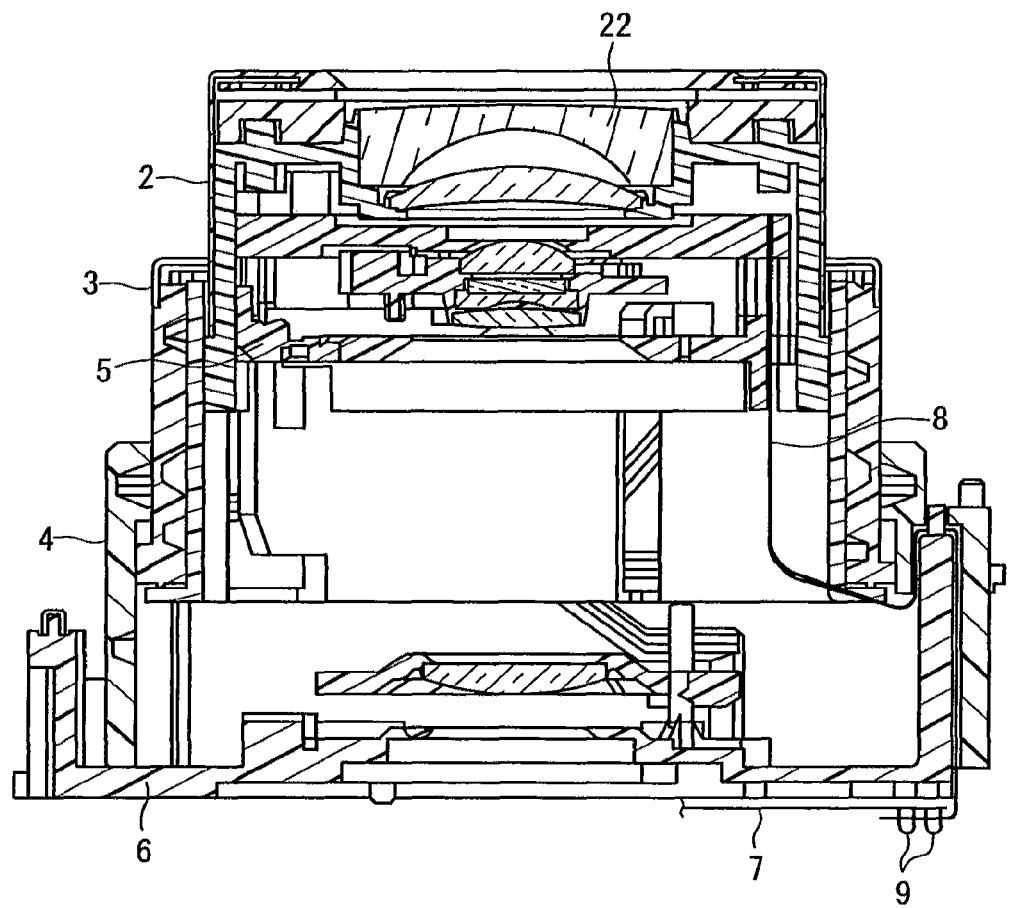
FIG. 2 is a cross-sectional view illustrating the configuration of the image pickup unit according to Embodiment 1.

FIG. 1 is a plan view of an image pickup unit according to Embodiment 1. FIG. 2 is a cross-sectional view of the image pickup unit, viewed along the Z-Z line shown in FIG. 1. The image pickup unit illustrated in FIGS. 1 and 2 is equivalent to a collapsible lens unit provided in, for example, a compact digital still camera. Note that the upper side of the image pickup unit 1 in FIG. 2 is the side in which an objective lens is disposed, and thus shall be referred to as the "objective lens side". Likewise, the lower side of the image pickup unit 1 is the side in which an image sensor is disposed, and thus shall be referred to as the "image surface side". A mobile frame unit shown in FIG. 2 and so on is configured of a first frame body 2, a second frame body 3, and a lens unit 5. The position of the mobile frame unit shown in FIG. 2, where the mobile frame unit is extended as far as possible, shall be referred to as the "extended position". Likewise, although not shown in the diagrams, the position of the mobile frame unit where the mobile frame unit is retracted to within the camera body shall be referred to as the "retracted position".

The image pickup unit 1 illustrated in FIGS. 1 and 2 includes the first frame body 2, the second frame body 3, a third frame body 4, the lens unit 5, a lens holder 6, a first FPC 7, and a second FPC 8. As shown in FIG. 1, the first frame body 2, the second frame body 3, and the third frame body 4 are disposed coaxially, central to the optical axis.

The first frame body 2 is formed in an approximately cylindrical shape, and is disposed on the inside of the second frame body 3 so as to be movable in the direction of the optical axis. Likewise, the second frame body 3 is formed in an approximately cylindrical shape, and is disposed on the inside of the third frame body 4 so as to be rotatable central to the optical axis in addition to being movable in the direction of the optical axis. The third frame body 4 is also formed in an approximately cylindrical shape, and is anchored to the lens holder 6. The first frame body 2 also includes a lens barrier 21 in the end portion on the objective lens side (the topmost portion shown in FIG. 2). The first frame body 2 holds an objective lens 22 in the vicinity of the end portion on the objective lens side. The lens barrier 21 is configured of two tabular members, and is arranged so as to be movable between a closed position, in which the objective lens 22 is concealed, and an open position, in which the objective lens 22 is exposed.

The lens unit 5 includes at least a zoom lens and an actuator that moves the zoom lens in the direction of the optical axis. The lens unit 5 can also be moved in the direction of the optical axis by causing the second frame body 3 to rotate central to the optical axis. Furthermore, the lens unit 5 also includes a focus lens and a driving means such as an actuator that can drive the focus lens in the direction of the optical axis.

The lens holder 6 is an approximately tabular member, and is anchored to the bottom surface of the third frame body 4. Furthermore, at least one lens, an image sensor such as a CCD image sensor, and an FPC that electrically connects the image sensor to an electric circuit provided with a microprocessor for processing signals, are disposed in the lens holder 6. Note that the lens holder 6 is also sometimes called the "master flange".

The first FPC 7 is anchored to the bottom surface of the lens holder 6 (the surface opposite the surface on which the third frame body 4 is disposed) using screws. It should be noted here that the first FPC 7 may be attached to the bottom surface of the lens holder 6 using glue, double-sided tape, or the like, or may be mechanically anchored using claw couplings or the like. The first FPC 7 electrically connects the second FPC 8, an electric circuit 13 (described later), and a lens driving motor (not shown) to one another.

The second FPC 8 electrically connects an actuator disposed in the lens unit 5 to the first FPC 7. Note that the first FPC 7 and the second FPC 8 are electrically connected via solder 9.

When the digital still camera is turned off, the first frame body 2, the second frame body 3, and the lens unit 5 are in a position in which they are retracted within the third frame body 4. In other words, the image pickup unit 1 is in a retracted position within the camera body (not shown), and does not protrude from the camera body. Note that for the sake of simplicity, diagrams illustrating the state in which the image pickup unit 1 is retracted within the camera body and the state in which the first frame body 2 and the second frame body 3 are retracted within the third frame body 4 have been omitted.

When the digital still camera is turned on while in the abovementioned retracted state, power is supplied to the lens driving motor, and the lens driving motor begins to operate. When the lens driving motor begins to operate, the first frame body 2, the second frame body 3, and the lens unit 5 begin to move in the direction of the optical axis. When the first frame body 2, the second frame body 3, and the lens unit 5 move into a predetermined extended position, as shown in FIG. 2, the lens driving motor stops operating.

Next, when a user manipulates a zoom switch, a release button, or the like, thereby executing zoom operations, focus operations, and so on, control signals for causing the zoom lens, focus lens, or the like to operate are outputted from the electric circuit. The respective outputted control signals are inputted to the lens driving motor via the first FPC 7, or the actuator of the lens unit 5 via the first FPC 7 and the second FPC 8. The lens driving motor moves the lens unit 5 in the direction of the optical axis based on the inputted control signal, and can therefore enlarge or reduce an optical image. Meanwhile, the actuator moves the focus lens in the direction of the optical axis based on the inputted control signal, thereby picking up an optical image on the imaging surface of the image sensor.

[2. Configuration of FPC]

Figure 3:
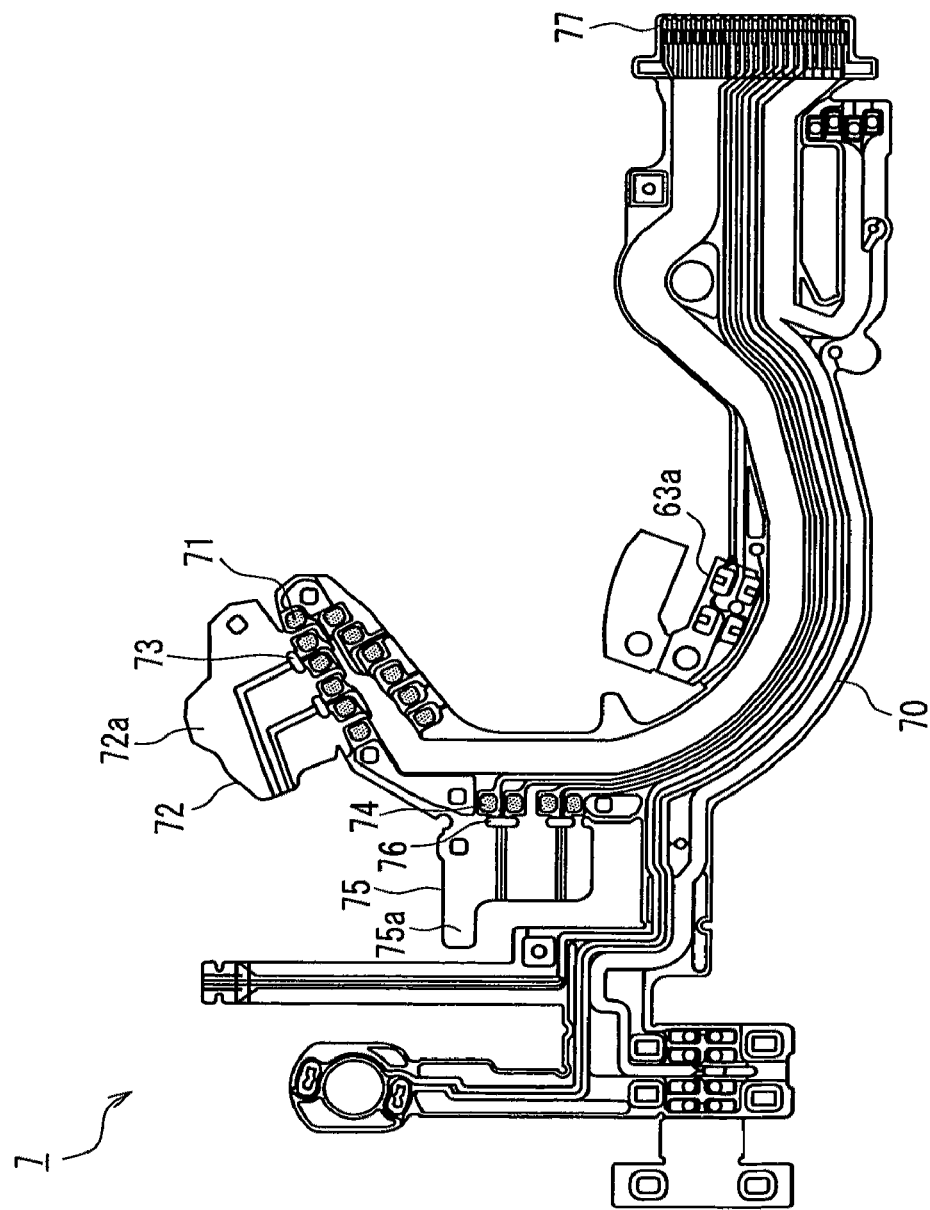
FIG. 3 is a plan view illustrating the configuration of a flexible printed circuit according to Embodiment 1.

FIG. 3 is a plan view illustrating the configuration of the first FPC 7. The first FPC 7 illustrated in FIG. 3 is configured, broadly speaking, of a main body portion 70, a first cover portion 72, and a second cover portion 75. The main body portion 70 includes a first connection portion 71, a first bent portion 73, a second connection portion 74, a second bent portion 76, and a connector connection portion 77. The first FPC 7 is configured with plural electric lines sandwiched between insulating film, and can be disposed in a device by being curved, bent, and so on.

The first connection portion 71 is disposed at one end of the first FPC 7, and the electric lines contained therein are partially exposed. The second FPC 8 is connected to the first connection portion 71 using solder or the like. The first connection portion 71 has a connection pattern, to which the various electrical lines are connected, so that the second FPC 8 can be soldered thereto. The first cover portion 72 is disposed in the vicinity of the first connection portion 71, sandwiching the first bent portion 73.

The first cover portion 72 is formed as part of the first FPC 7, and is formed in a size and shape capable of concealing at least the first connection portion 71. The first cover portion 72 can electrically insulate the first connection portion 71 from other members when the first cover portion 72 is disposed in a position in which it conceals the first connection portion 71. Therefore, the space between the front and back of the first cover portion 72 is electrically insulated. The surface of the first cover portion 72 that opposes the first connection portion 71 is defined as the "first surface". A first insertion portion 72a is formed at the end portion of the first cover portion 72 so as to protrude in the outward direction therefrom. The first insertion portion 72a has a shape and size that enables its tip to be disposed between a metal plate 61 (described later; see FIG. 4) and the lens holder 6 when the first cover portion 72 is bent along the first bent portion 73.

The first bent portion 73 is formed between the first connection portion 71 and the first cover portion 72, and is a portion that is bent when the first cover portion 72 is moved upon the first connection portion 71. The first bent portion 73 may have holes formed therewithin, may be formed thinner than the other areas, or the like, so as to be easily bendable. However, note that the first bent portion 73 is not required to be formed thinner than the other areas, and may be formed so as to have the same thickness as the other areas.

The second connection portion 74 is formed in a different area than the first connection portion 71, and the electric lines contained therein are partially exposed. The second connection portion 74 has a connection pattern, to which the various electrical lines are connected, so that another FPC, a printed circuit, or the like can be soldered thereto. The second cover portion 75 is disposed in the vicinity of the second connection portion 74, sandwiching the second bent portion 76.

The second cover portion 75 is formed as part of the first FPC 7, and is formed in a size and shape capable of concealing at least the second connection portion 74. The second cover portion 75 can electrically insulate the second connection portion 74 from other members when the second cover portion 75 is disposed in a position in which it conceals the second connection portion 74. Therefore, the space between the front and back of the second cover portion 75 is electrically insulated. The surface of the second cover portion 75 that opposes the second connection portion 74 is defined as the "first surface". A second insertion portion 75a is formed at the end portion of the second cover portion 75 so as to protrude in the outward direction therefrom. The second insertion portion 75a has a shape and size that enables its tip to be disposed between the metal plate 61 (described later; see FIG. 4) and the lens holder 6 when the second cover portion 75 is bent along the second bent portion 76.

The second bent portion 76 is formed between the second connection portion 74 and the second cover portion 75, and is a portion that is bent when the second cover portion 75 is moved upon the second connection portion 74. The second bent portion 76 may have holes formed therewithin, may be formed thinner than the other areas, or the like, so as to be easily bendable. However, note that the second bent portion 76 is not required to be formed thinner than the other areas, and may be formed so as to have the same thickness as the other areas.

The connector connection portion 77 is formed at an end of the first FPC 7, and exposes the electrical lines disposed within the first FPC 7. The first FPC 7 and an electric circuit can be connected by electrically connecting the connector connection portion 77 to a connector provided in the electric circuit.

[3. Arrangement of FPC]

Figure 4:
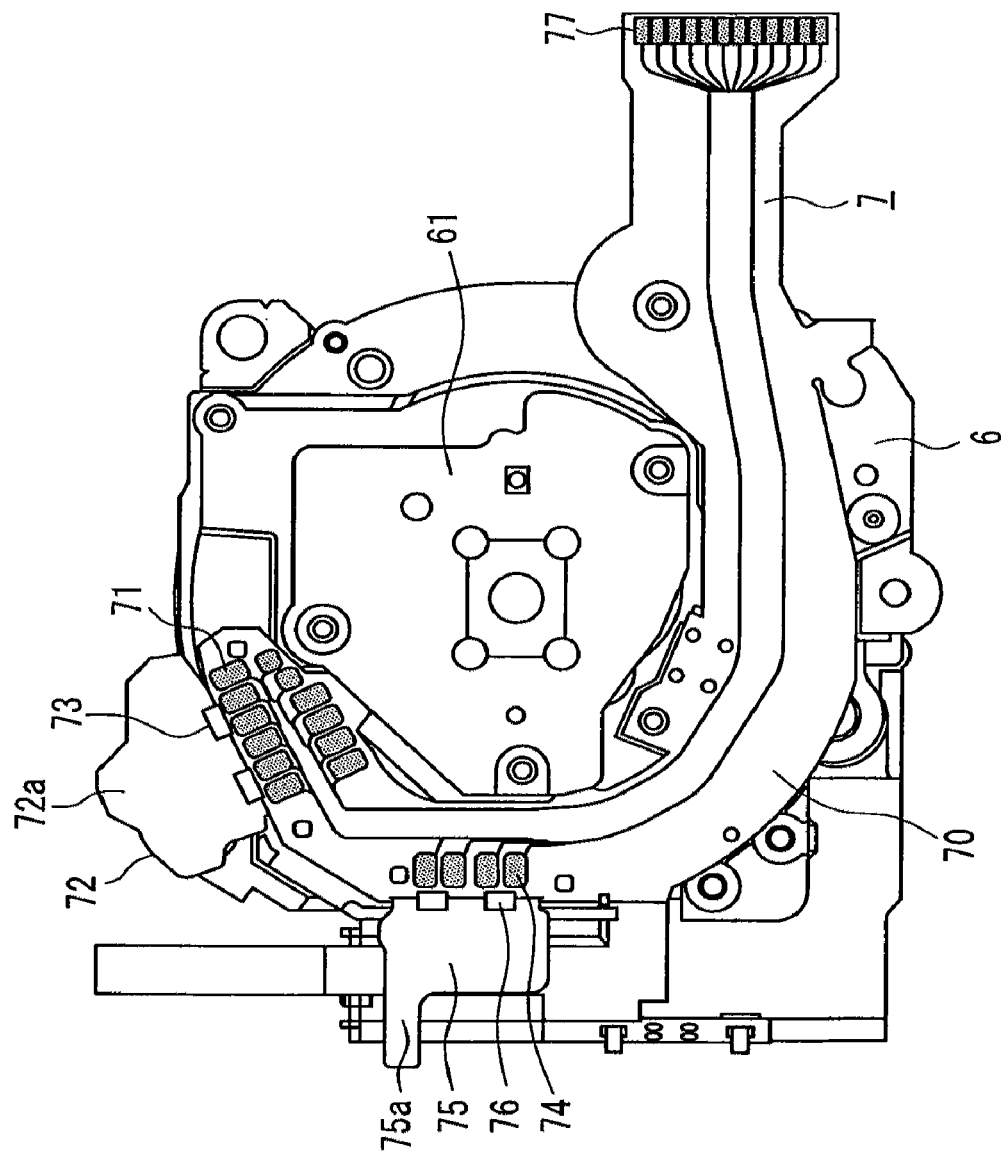
FIG. 4 is a plan view illustrating the configuration of an image pickup unit provided with the flexible printed circuit according to Embodiment 1 (prior to connection portions being concealed).

FIG. 4 is a plan view illustrating a state in which the first FPC 7 illustrated in FIG. 3 is provided in the image pickup unit 1, and shows the bottom surface side of the image pickup unit 1 that is to be provided within an image pickup device such as a digital still camera. Although FIG. 4 omits drawings of some of the electrical lines of the first FPC 7, it is nevertheless assumed that the first FPC 7 including the electrical lines as shown in FIG. 3 is disposed here. Furthermore, although the second FPC 8 is connected to the first connection portion 71, illustrations of the second FPC 8 have been omitted from FIG. 4. As shown in FIG. 4, the metal plate 61, which is a metallic material, is disposed on the bottom surface of the lens holder 6 in order to improve the accuracy of the position in which the image sensor (not shown) is attached. Note that a different member, such as a plate made of resin, may be utilized in place of the metal plate 61.

As shown in FIG. 4, the first FPC 7 disposed on the bottom surface of the lens holder 6 is in a state where the first connection portion 71 and the second connection portion 74 are exposed. In this state, the first cover portion 72 is bent along the first bent portion 73, and the first surface of the first cover portion 72 is arranged so as to be opposite the first connection portion 71. Then, the tip of the first insertion portion 72a formed in the first cover portion 72 is inserted between the bottom surface of the lens holder 6 and the metal plate 61.

In the same manner, the second cover portion 75 is bent along the second bent portion 76, and the first surface of the second cover portion 75 is arranged so as to be opposite the second connection portion 74. Then, the tip of the second insertion portion 75a formed in the second cover portion 75 is inserted between the bottom surface of the lens holder 6 and the metal plate 61.

Figure 5:
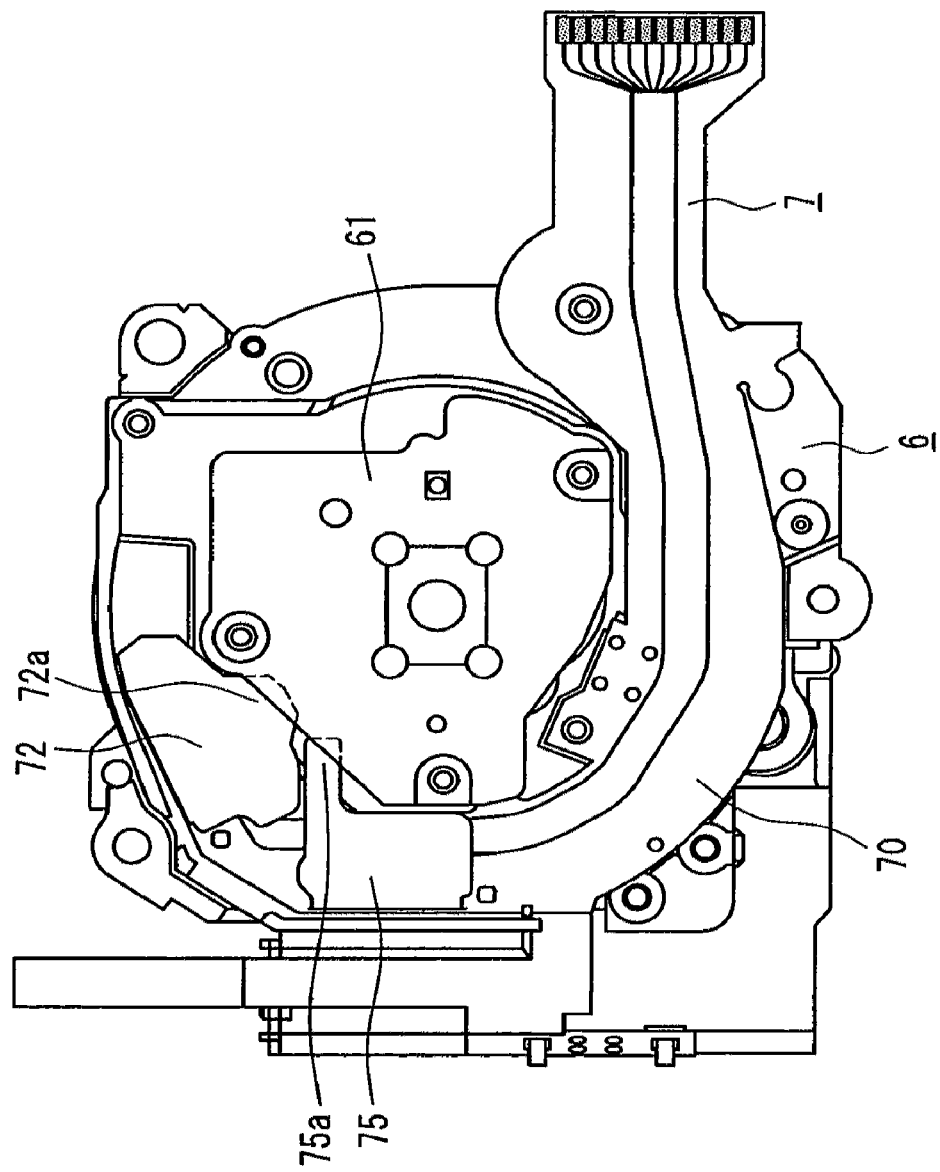
FIG. 5 is a plan view illustrating the configuration of the image pickup unit provided with the flexible printed circuit according to Embodiment 1 (after the connection portions have been concealed).
Figure 6:
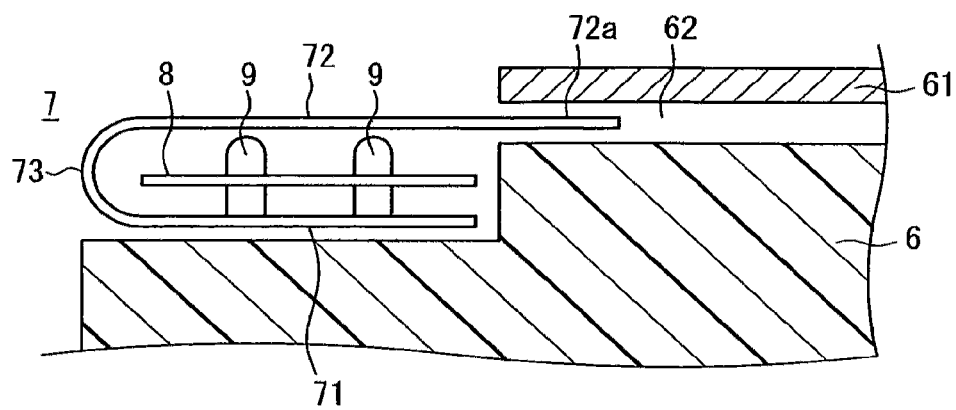
FIG. 6 is a cross-sectional view of the area around a first connection portion and a first cover portion according to Embodiment 1.

The state in which the first insertion portion 72a and the second insertion portion 75a have been inserted between the bottom surface of the lens holder 6 and the metal plate 61 is illustrated in FIGS. 5 and 6. FIG. 5 is a plan view, viewed from the same angle as in FIG. 4. FIG. 6 is a cross-sectional view illustrating the state in which the first insertion portion 72a has been inserted between the bottom surface of the lens holder 6 and the metal plate 61. As shown in FIG. 6, there is a small space 62 between the bottom surface of the lens holder 6 and the metal plate 61. It is sufficient for the space 62 to be of a width (that is, the vertical dimension in FIG. 6.) that allows at least the first insertion portion 72a and the second insertion portion 75a to be inserted and held. In the present embodiment, the space 62 is formed so as to be slightly larger than the combined thickness of the first insertion portion 72a and the second insertion portion 75a. Forming the space in such a manner makes it possible to hold the first insertion portion 72a and the second insertion portion 75a, and because the first insertion portion 72a and the second insertion portion 75a can easily be inserted into the space 62, the ease of assembly can also be improved.

As shown in FIGS. 5 and 6, disposing the first cover portion 72, which has been bent along the first bent portion 73, so as to oppose the first connection portion 71, to which the second FPC 8 is connected, makes it possible to use the first cover portion 72 to electrically insulate the first connection portion 71, to which the second FPC 8 is connected using the solder 9, from other areas. Furthermore, holding the first insertion portion 72a and the second insertion portion 75a between the bottom surface of the lens holder 6 and the metal plate 61 prevents the first connection portion 71 and the second connection portion 74 from being exposed. Accordingly, a state of electrical insulation can be maintained between the first connection portion 71/the second connection portion 74 and the other areas.

[4. Example of FPC Provided in Image Pickup Device]

Figure 7:
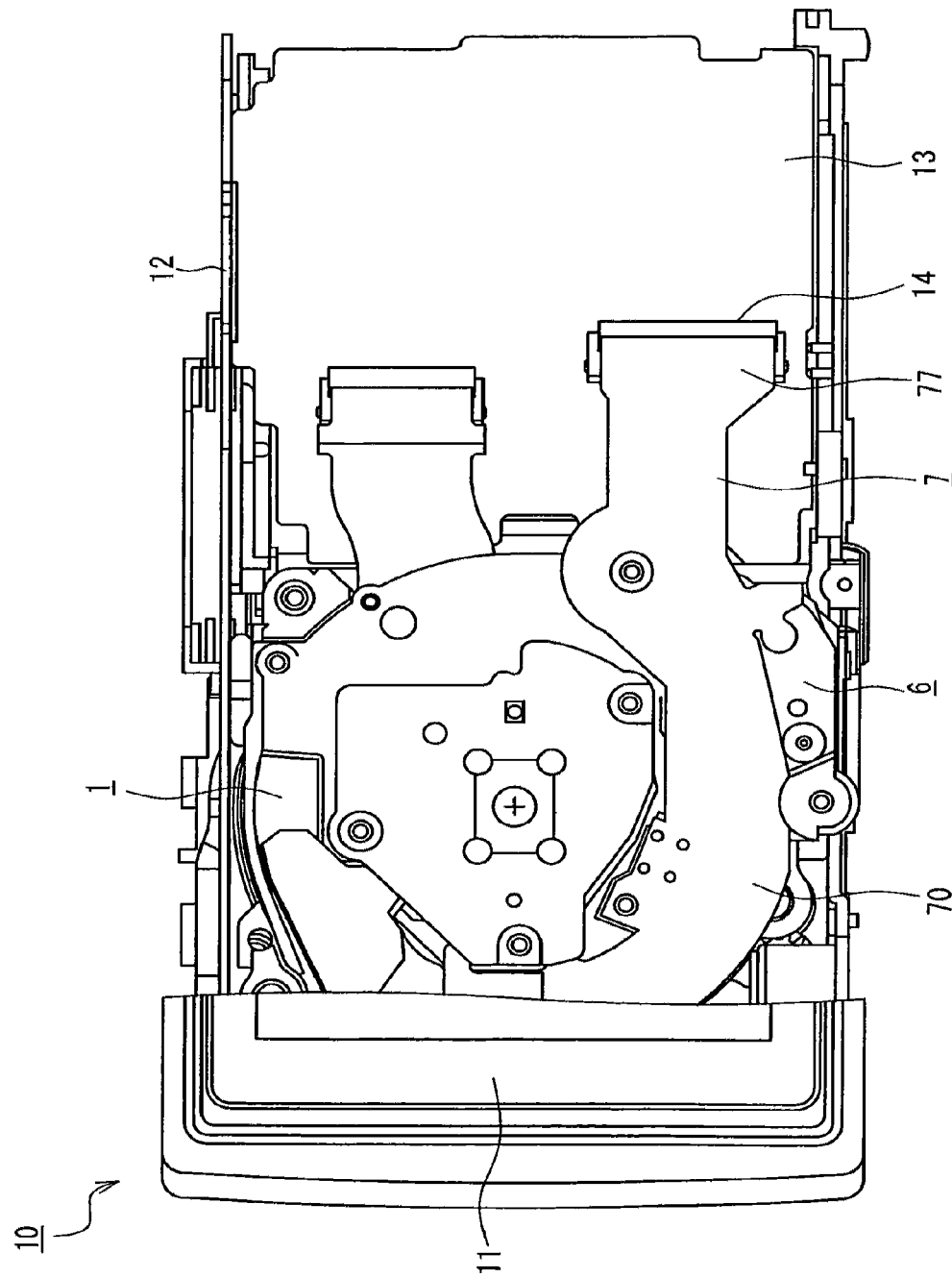
FIG. 7 is a plan view illustrating the internal structure of an image pickup device provided with the image pickup unit according to Embodiment 1.

In the image pickup device according to the present embodiment, a liquid-crystal monitor 11 is disposed in the area opposite the bottom surface of the lens holder 6, as shown in FIG. 7. A metallic plate is disposed on the back surface of the liquid-crystal monitor 11 (the surface opposite the display surface) as a countermeasure against spurious emissions and static electricity. Although the back surface of the liquid-crystal monitor 11 is disposed opposite the area that is opposite the first connection portion 71, in the present embodiment, the first cover portion 72 is disposed between the first connection portion 71 and the back surface of the liquid-crystal monitor 11, and thus the first connection portion 71 and the liquid-crystal monitor 11 can be electrically insulated from one another. Note that FIG. 7 is a plan view illustrating the internal structure of the image pickup device, and shows the device housing including the liquid-crystal monitor 11 with part of the housing broken away. As can be seen in FIG. 7, a frame 12 that holds the image pickup unit 1, a printed circuit 13 on which a microprocessor for signal processing and the like is mounted, a connector 14 that is mounted on the printed circuit 13 and to which the first FPC 7 is connected, and the like are disposed within the image pickup device.

Disposing the second cover portion 75 in the same manner as the abovementioned first cover portion 72 makes it possible to electrically insulate the second connection portion 74 from the liquid-crystal monitor 11. Furthermore, inserting and holding the second insertion portion 75a in the space 62 makes it possible to cause the lens holder 6 to hold the second cover portion 75, thus making it difficult for the second connection portion 74 to become exposed. Accordingly, a state of electrical insulation can be maintained between the second connection portion 74 and the liquid-crystal monitor 11.

With the first FPC 7 disposed within the image pickup device in such a manner, the printed circuit 13 and the first FPC 7 can be electrically connected to one another by the connector connection portion 77 being connected to the connector 14 mounted on the printed circuit 13.

[5. Effects of the Embodiment, Etc.]

According to the present embodiment, the first cover portion 72 and the second cover portion 75 are formed as part of the first FPC 7, and the first connection portion 71 and the second connection portion 74 are disposed so as to be opposite one another, which makes it possible to prevent the first connection portion 71 and the second connection portion 74 from making electrical contact with other areas.

Furthermore, the first insertion portion 72a is formed in the first cover portion 72, the second insertion portion 75a is formed in the second cover portion 75, and the first insertion portion 72a and the second insertion portion 75a are inserted and held in the space 62 between the bottom surface of the lens holder 6 and the metal plate 61, which makes it possible to carry out the positioning of the first cover portion 72 and the second cover portion 75. Accordingly, the state of insulation of the first connection portion 71 and the second connection portion 74 provided by the first cover portion 72 and the second cover portion 75 can be maintained even if shock, vibration, or the like is affected on the image pickup device.

By forming the first cover portion 72 and the second cover portion 75 as part of the first FPC 7, the method of forming the first cover portion 72 and the second cover portion 75 only requires the cut (punched-out) shape to be changed in the step of creating the first FPC 7, and thus can be implemented without an excessive increase in cost. Furthermore, in the step of creating the first FPC 7, planning out the shape, arrangement, and so on of the first FPC 7 so that the number of first FPCs 7 that can be created from a single uncut FPC does not decrease makes it possible to implement the method with no increase in cost whatsoever.

Furthermore, by forming the first cover portion 72 and the second cover portion 75 from a part of the first FPC 7, the FPC is thin, and thus the image pickup unit 1 and the image pickup device do not experience an increase in size.

Furthermore, the member that holds the first insertion portion 72a and the second insertion portion 75a is realized by the existing metal plate 61, and thus can be implemented without increasing the number of components and the cost.

Furthermore, forming the first bent portion 73 and the second bent portion 76 makes it possible to bend the first FPC 7 securely and with ease. The ease of assembly can thus be improved.

Furthermore, forming the first bent portion 73 and the second bent portion 76 makes it difficult for the bent first FPC 7 to return to its original shape, and thus the state of insulation of the first connection portion 71 and the second connection portion 74 provided by the first cover portion 72 and the second cover portion 75 can be maintained.

It should be noted that although two cover portions, the first cover portion 72 and the second cover portion 75, are provided in the present embodiment, the present invention can be implemented as long as there is at least one cover portion. The same effects can also be obtained with three or more cover portions.

Furthermore, although the first cover portion 72 and the second cover portion 75 are formed in the first FPC 7 in the present embodiment, the same effects can be obtained even if the first cover portion 72 and the second cover portion 75 are formed in the second FPC 8.

Furthermore, in addition to the configuration described in the present embodiment, in which the first cover portion 72 is sandwiched between the bottom surface of the lens holder 6 and the metal plate 61, a configuration in which holes through which screws can be passed are formed in the first cover portion 72, screws are passed through the holes, and the screws are then threaded into screw holes formed in the lens holder 6, may be used as another method for anchoring the first cover portion 72. Such a configuration makes it possible to securely anchor the first cover portion 72 to the lens holder 6, and the first cover portion 72 will not become detached easily. Another configuration exists in which holes are formed in the first cover portion 72, and claw portions formed in the lens holder 6 are coupled with the holes, thereby anchoring the first cover portion 72 to the lens holder 6. There is yet another configuration in which a hole is formed in the main body portion 70, and the first insertion portion 72a is inserted and held in the hole. The abovementioned configuration that carries out anchoring by coupling holes with claw portions makes it possible to hold the cover portion with ease, thereby improving the ease of assembly. Moreover, the configuration that carries out anchoring by inserting the first insertion portion 72a into the hole does not increase the cost, because the metal plate 61, screws, claw portions, and so on are not necessary. Note that the above examples of configurations can also be applied to the second cover portion 75.

In the present embodiment, the configuration described has the space 62 formed so that its width is greater than the thickness of the first FPC 7, and thus the first insertion portion 72a and the second insertion portion 75a can be lightly inserted and held in the space 62. However, the configuration may be such that the space 62 is formed so that its width is similar to the thickness of the first FPC 7, and the first insertion portion 72a and the second insertion portion 75a are lightly press-fitted into the space 62. Such a configuration makes it possible to more securely anchor the first cover portion 72 and the second cover portion 75 to the lens holder 6.

Furthermore, although the configuration of the present embodiment is such that the first insertion portion 72a and the second insertion portion 75a are inserted and held in the space 62, the first insertion portion 72a and the second insertion portion 75a may be anchored to the lens holder 6 using a fastening means, such as a screw, after being inserted into the space 62. In such a case, it is possible to, for example, pass the screw through the metal plate 61 and the first insertion portion 72a (or the second insertion portion 75a) and thread the screw into a screw hole formed in the bottom surface of the lens holder 6, thereby anchoring the rib. With such a configuration the first cover portion 72 and the second cover portion 75 are securely anchored to the image pickup unit 1, and thus the state of insulation of the first connection portion 71 and the second connection portion 74 can be ensured.

Embodiment 2

Figure 8:
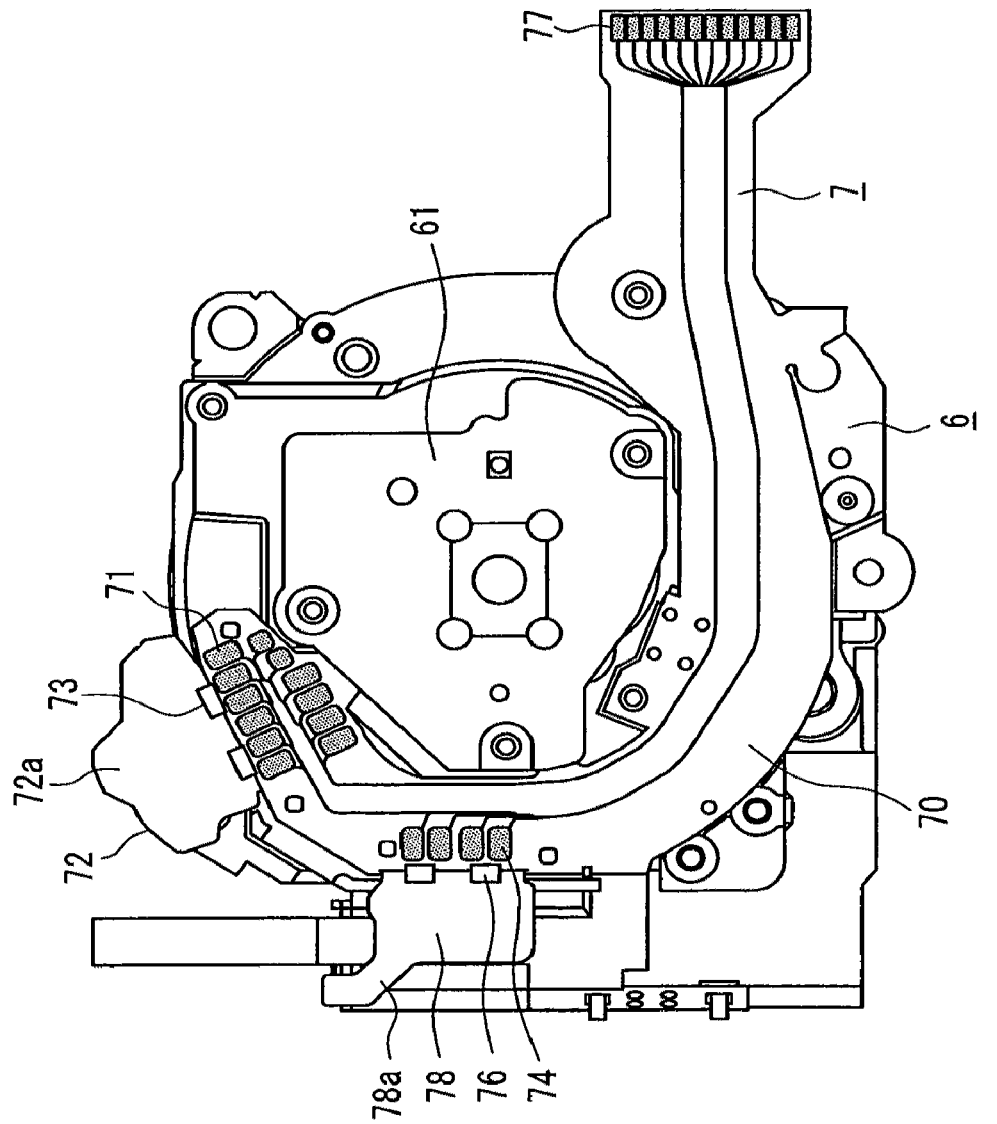
FIG. 8 is a plan view illustrating the configuration of an image pickup unit provided with a flexible printed circuit according to Embodiment 2 (prior to connection portions being concealed).
Figure 9:
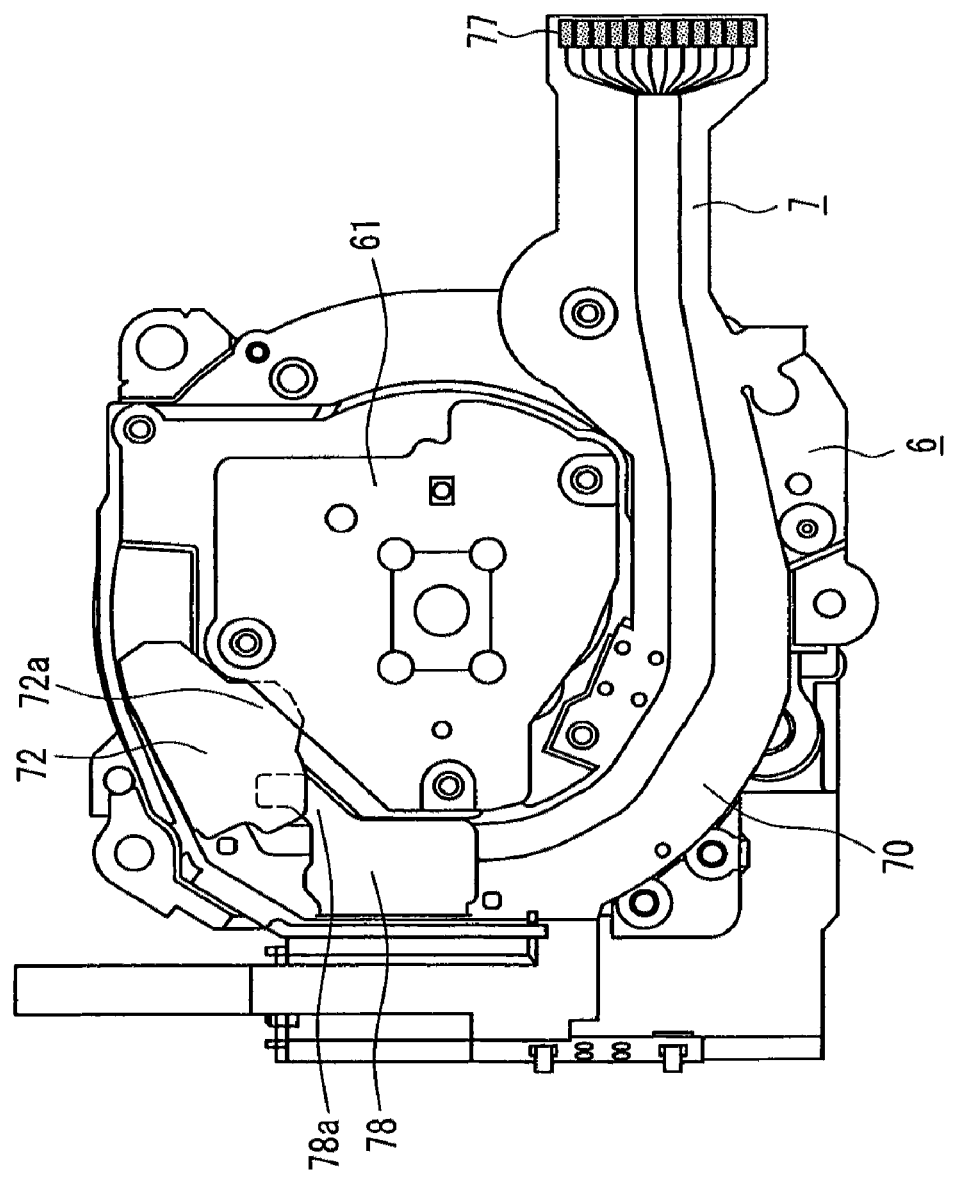
FIG. 9 is a plan view illustrating the configuration of an image pickup unit provided with the flexible printed circuit according to Embodiment 2 (after the connection portions have been concealed).

FIGS. 8 and 9 illustrate the configuration of an image pickup device provided with a flexible printed circuit according to Embodiment 2. FIG. 8 illustrates a state in which connection portions are exposed, whereas FIG. 9 illustrates a state in which the connection portions are concealed by cover portions. Note that structures described in Embodiment 2 that are identical to structures described in Embodiment 1 shall be given the same reference numerals, and detailed descriptions thereof shall be omitted. The flexible printed circuit of Embodiment 2 differs from the flexible printed circuit of Embodiment 1 in that a third cover portion 78 is provided instead of the second cover portion 75.

The third cover portion 78 is formed as part of the first FPC 7, and is formed in a size and shape capable of concealing at least the second connection portion 74. The third cover portion 78 can electrically insulate the second connection portion 74 from other members when the third cover portion 78 is disposed in a position in which it conceals the second connection portion 74, such as is illustrated in FIG. 9. Therefore, the space between the front and back of the third cover portion 78 is electrically insulated. The surface of the third cover portion 78 that opposes the second connection portion 74 is defined as the "first surface". A third insertion portion 78a is formed at the end portion of the third cover portion 78 so as to protrude in the outward direction therefrom. The third insertion portion 78a has a shape and size that enables at least part of itself to be disposed between the first cover portion 72 and the main body portion 70 when the first cover portion 72 is bent along the first bent portion 73 and the third cover portion 78 is bent along the second bent portion 76, as illustrated in FIG. 9.

When the first cover portion 72 and the third cover portion 78 are bent from the state shown in FIG. 8, the third cover portion 78 is first bent along the second bent portion 76, and the first cover portion 72 is then bent along the first bent portion 73. At this time, the first cover portion 72 is arranged so as to cover at least part of the third cover portion 78. In the present embodiment, the first cover portion 72 covers the third insertion portion 78a.

Next, the first insertion portion 72a is inserted between the bottom surface of the lens holder 6 and the metal plate 61. Through this, the first cover portion 72 is sandwiched between the bottom surface of the lens holder 6 and the metal plate 61, and is held in a state in which it conceals the first connection portion 71. The third cover portion 78 is pushed down by the first cover portion 72, and is thus held in a state in which it conceals the second connection portion 74. According to the present embodiment as described thus far, the configuration is such that the third insertion portion 78a formed in the third cover portion 78 is pushed down and held by the first cover portion 72, which makes it possible to improve the workability when concealing the first connection portion 71 and the second connection portion 74, and also makes it possible to improve the ease of assembly of the image pickup device. In other words, although the operation for inserting part of the flexible printed circuit into the space between the bottom surface of the lens holder 6 and the metal plate 61 is not easy, the present embodiment makes it possible for the first connection portion 71 to be concealed by the first cover portion 72 and the second connection portion 74 to be concealed by the third cover portion 78 simply by inserting the first cover portion 72 between the bottom surface of the lens holder 6 and the metal plate 61. It is thus possible to improve the workability as compared to the configuration in which both the first cover portion 72 and the third cover portion 78 are inserted between the bottom surface of the lens holder 6 and the metal plate 61.

It should be noted that although the configuration of the present embodiment is such that part of the third cover portion 78 (that is, the third insertion portion 78a) is pushed down and held by the first cover portion 72, the same effects can be obtained even with a configuration in which part of the first cover portion 72 is pushed down and held by the third cover portion 78 and part of the third cover portion 78 is inserted in and held between the bottom surface of the lens holder 6 and the metal plate 61.

Furthermore, although the present embodiment described two cover portions, which are the first cover portion 72 and the third cover portion 78, the same effects can be obtained even if there are three or more cover portions. For example, in the case where there are three cover portions, a configuration can be considered in which the first cover portion and the second cover portion are pushed down and held by the third cover portion, or the first covered portion is pushed down and held by the second cover portion and the second covered portion is then pushed down and held by the third covered portion. With such a configuration, only a single cover portion is required to be inserted between the lens holder and the metal plate regardless of how many cover portions are present, and thus the workability is not significantly different from that of Embodiment 1.

Furthermore, although the configuration of the present embodiment includes the first cover portion 72, which conceals the first connection portion 71, and the third cover portion 78, which conceals the second connection portion 74, the present embodiment can also be applied in a configuration in which a single connection portion is concealed by the first cover portion 72 and the third cover portion 78.

Furthermore, although the "image pickup device" has, in the first and second embodiments, been described as equivalent to a device such as a digital still camera, the image pickup unit 1 itself is considered to fall within the scope of an "image pickup device".

Embodiment 3

According to Embodiment 1 of the present invention, the cover portions 72, 75 are anchored with an auxiliary member of the lens holder 6 such as the metal plate 61. In contrast, according to Embodiment 3 of the present invention, a hole is provided in the main body portion of the FPC and a protrusion is provided in the cover portion, and the protrusion is inserted in the hole, whereby the cover portion is anchored to the main body portion at the protrusion. Thus, the cover portion can be anchored easily even without providing another member for anchoring.

Figure 10:
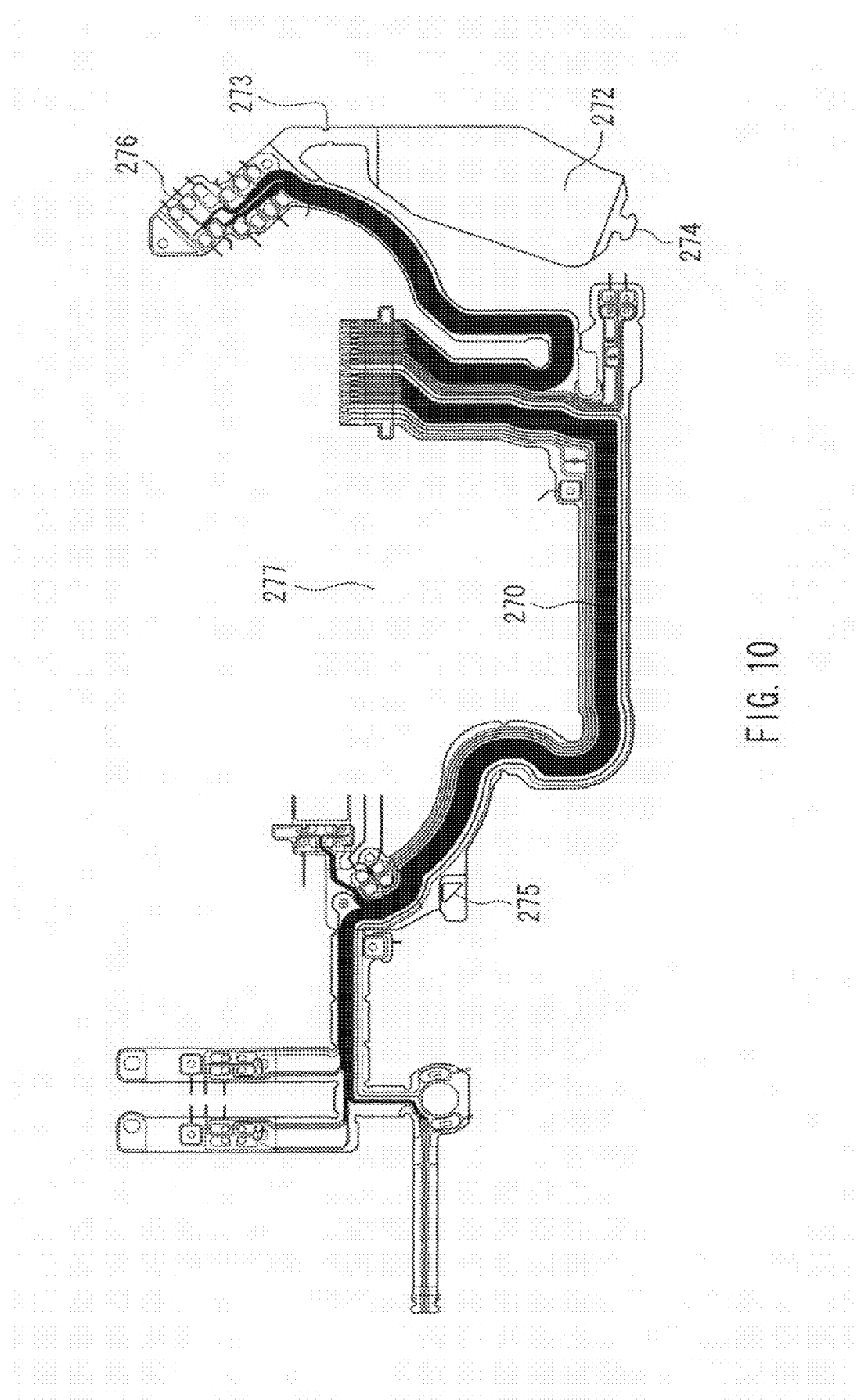
FIG. 10 is a plan view illustrating the configuration of a flexible printed circuit according to Embodiment 3.

FIG. 10 is a plan view of a flexible printed circuit 277 according to Embodiment 3. A cover portion 272 is formed as part of a main body portion 270 via a bent portion 273. The bent portion 273 is formed with a small width so as to facilitate bending. A connection portion 276 is formed at the main body portion 270. After the flexible printed circuit 277 is incorporated in electronic equipment, the connection portion 276 is covered by the cover portion 272. The main body portion 270 is provided with an insertion hole 275. The cover portion 272 is provided with an insertion protrusion 274.

Figure 11:
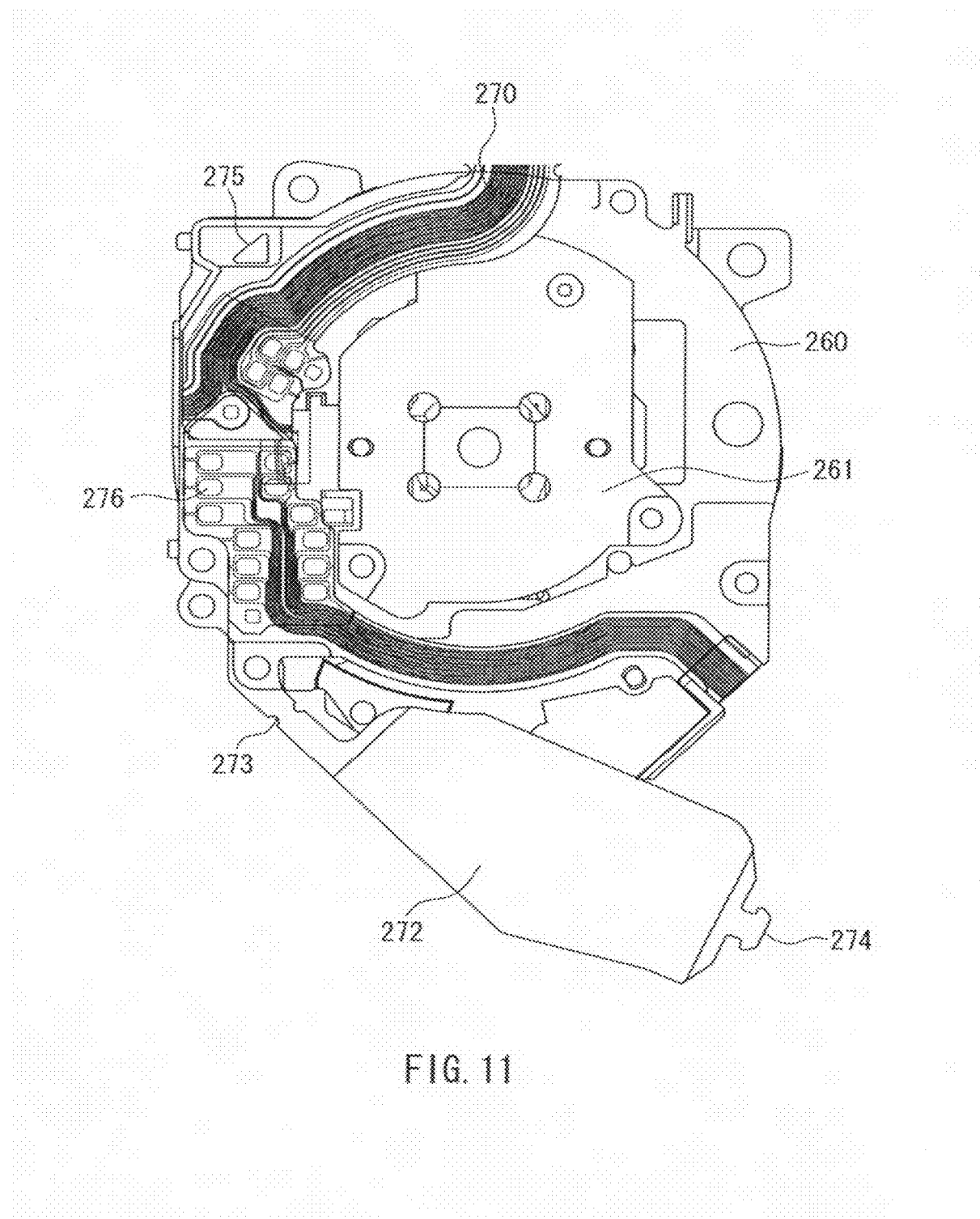
FIG. 11 is a bottom view illustrating the configuration of an image pickup unit on which the flexible printed circuit according to Embodiment 3 is mounted (prior to the connection portions being concealed).

FIG. 11 is a bottom view illustrating the state in which the flexible printed circuit 277 is attached to the bottom surface of a lens holder 260. In this state, the cover portion 272 has not covered the connection portion 276. Although the lens holder 260 is provided with a metal plate 261, the metal plate 261 is not used for anchoring the cover portion 272 in Embodiment 3.

Figure 12:
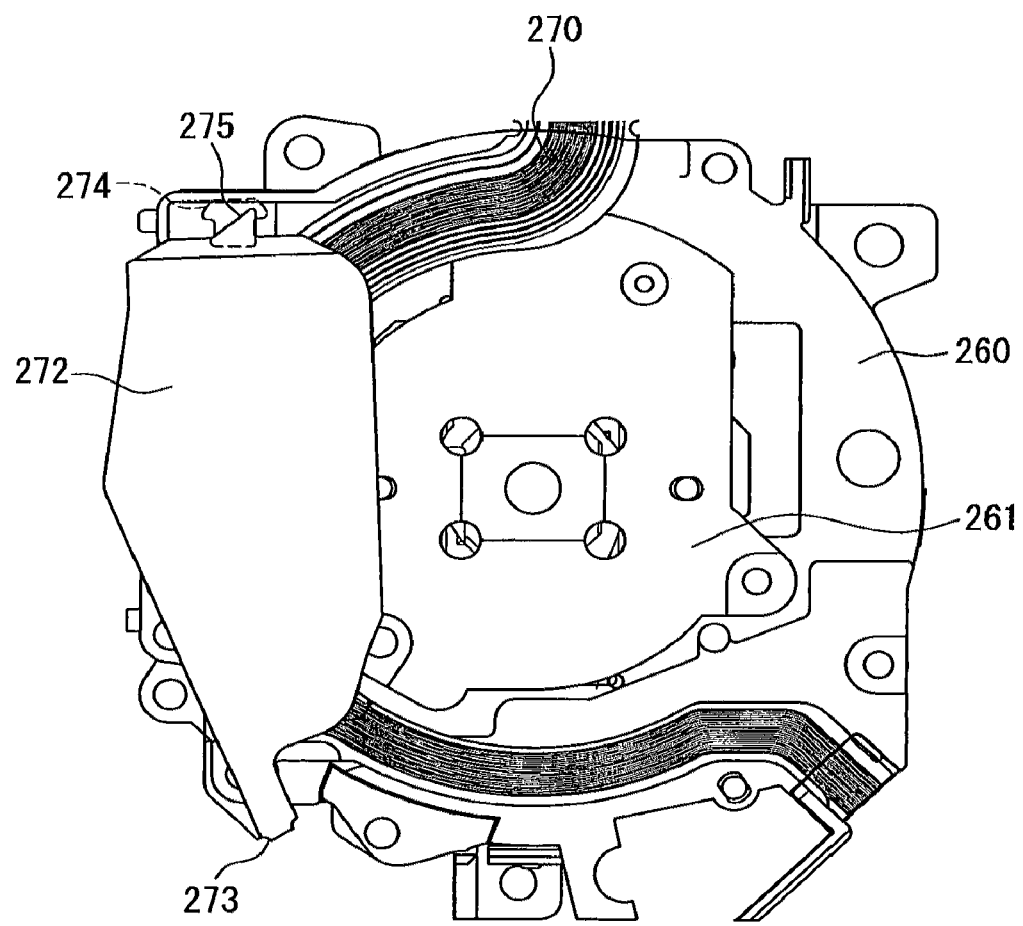
FIG. 12 is a bottom view illustrating the configuration of an image pickup unit on which the flexible printed circuit according to Embodiment 3 is mounted (after the connection portions have been concealed).

FIG. 12 is a bottom view illustrating the state in which the cover 272 covers the connection portion 276 while the flexible printed circuit 277 is attached to the bottom surface of the lens holder 260. The cover portion 272 is bent at the bent portion 273. The insertion protrusion 274 is inserted in the insertion hole 275. Consequently, the cover portion 272 is anchored to the main body portion 270 while covering the connection portion 276.

Figure 13:
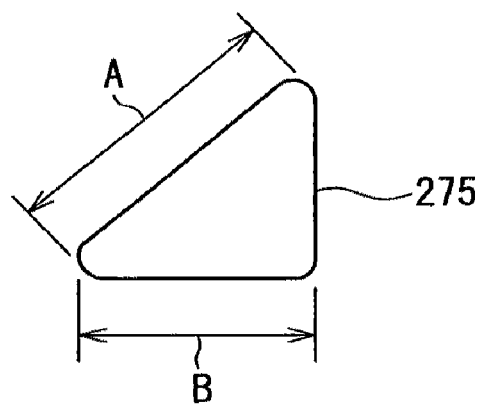
FIG. 13 is a plan view illustrating the shape of a hole according to Embodiment 3.
Figure 14:
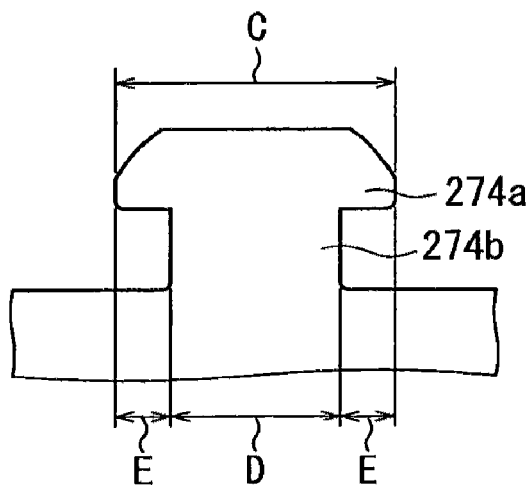
FIG. 14 is a plan view illustrating the shape of a protrusion according to Embodiment 3.

FIG. 13 is a schematic view illustrating the shape of the hole 275. FIG. 14 is a schematic view illustrating the shape of the protrusion 274. Herein, it is assumed that the length of an oblique side of the insertion hole 275 is A, and the length of a base is B. Furthermore, it is assumed that the length of a tip end portion 274a of the insertion protrusion 274 is C, and the length of the root portion 274b is D. Furthermore, the difference between the tip end portion 274a and the root portion 274b is 2E.

The oblique side of the insertion hole 275 is larger than the base thereof That is, A>B . . . (Expression 1) holds.

Furthermore, the tip end portion 274a has a width larger than that of the root portion 274b. That is, C>D . . . (Expression 2) holds.

C=D+2E . . . (Expression 3) also holds.

Figure 15:
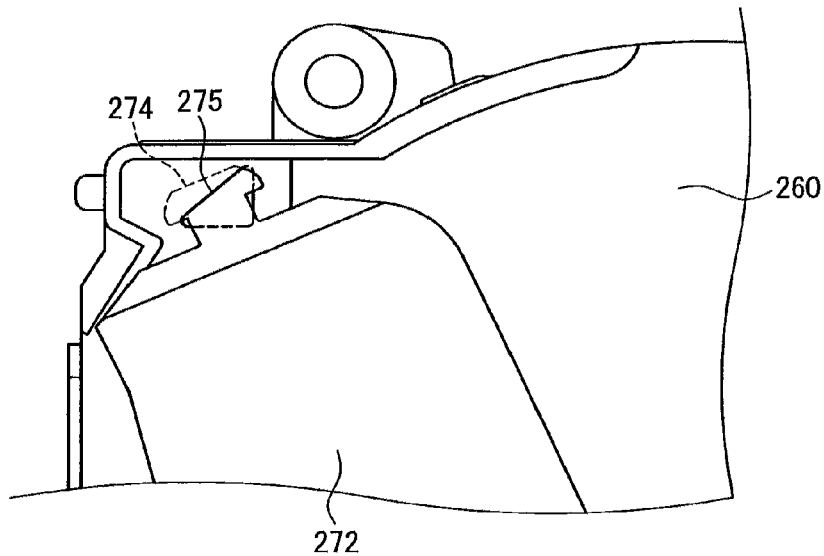
FIG. 15 is a plan view illustrating the state while the protrusion according to Embodiment 3 is inserted in the hole.

As shown in FIG. 15, when the insertion protrusion 274 is inserted in the insertion hole 275, the insertion protrusion 274 may be placed along the oblique side of the insertion hole 275. This facilitates the insertion because the oblique side is opened widely. At this time, A>C . . . (Expression 4) preferably holds. This is because when the length of the opening of the insertion hole 275 is larger than that of the tip end portion 274a, the insertion protrusion 274 is not hooked on the insertion hole 275 during insertion, and the insertion becomes satisfactory.

It should be noted that the oblique side of the insertion hole 275 may be slightly smaller than the tip end portion 274a. That is, A may be equal to or smaller than C. In this case, when the insertion protrusion 274 is inserted in the insertion hole 275, it is necessary to push the insertion protrusion 274 into the insertion hole 275 while deforming the tip end portion 274a slightly.

Furthermore, even in the case where A is equal to or smaller than C,

A>C−E . . . (Expression 5) preferably holds. In this case, if an attempt is made so as to insert both sides of the tip end portion 274a into the insertion hole 275 simultaneously, it is necessary to push the tip end portion 274a into the insertion hole 275 while deforming the tip end portion 274a slightly, as described above. However, if one side of the tip end portion 274a is inserted first into the insertion hole 275, and thereafter, the other side of the tip end portion 274a is inserted in the insertion hole 275, the tip end portion 274a can be inserted in the insertion hole 275 easily without deforming the tip end portion 274a in a width direction. Thus, even in the case where Expression 4 does not hold, if Expression 5 holds, the ease of insertion can be maintained when the insertion protrusion 274 is inserted in the insertion hole 275.

Figure 16:
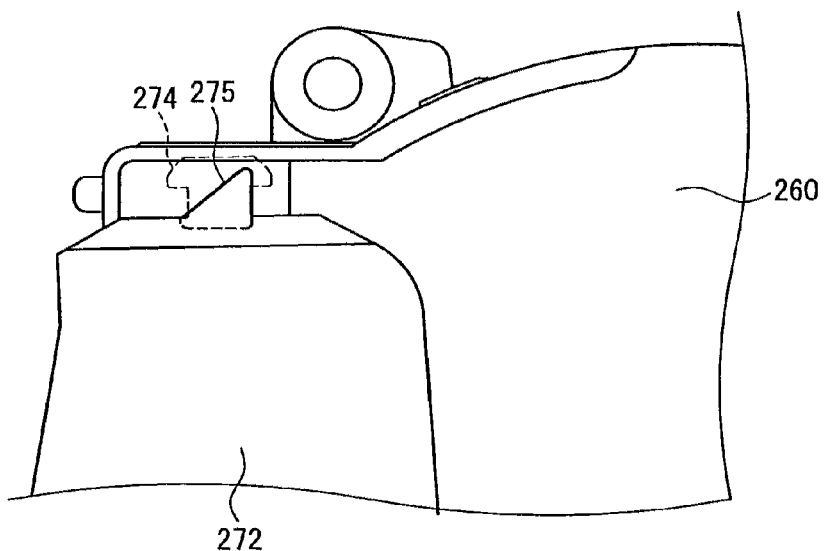
FIG. 16 is a plan view illustrating the state after the protrusion according to Embodiment 3 is inserted in the hole.
Figure 19:
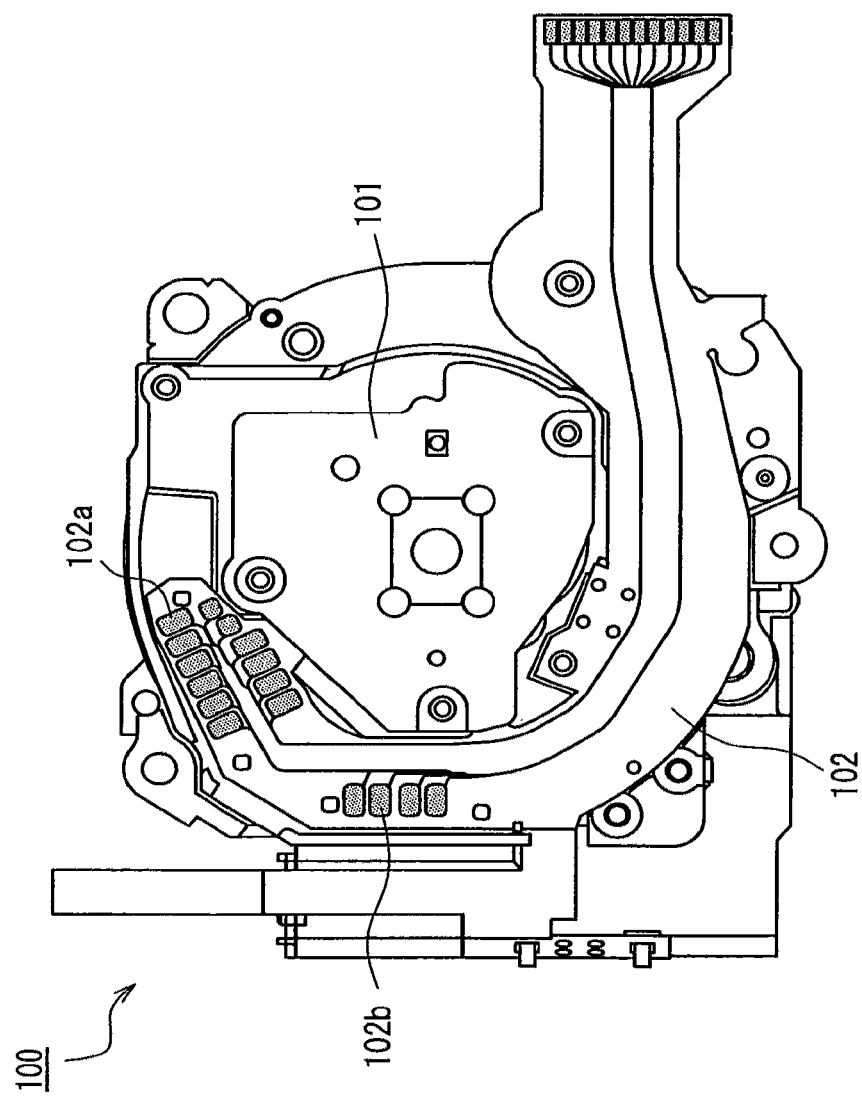
FIG. 19 is a plan view illustrating the configuration of a conventional image pickup unit.

As shown in FIG. 16, after the insertion protrusion 274 is inserted in the insertion hole 275, the cover portion 272 is rotated. That is, the cover portion 272 is placed so that the tip end portion 274a of the insertion protrusion 274 is accommodated at the base of the insertion hole 275 while the cover portion 272 covers the connection portion 276. In this state, it is preferred that the base of the insertion hole 275 is smaller than the base of the insertion hole 275, and is larger than the root portion 274b of the insertion protrusion 274. That is, A>B>D . . . (Expression 6) preferably holds. This is because the cover portion 272 can be brought into a stable state without stress being applied to the root portion 274b. Furthermore, it is preferred that the base of the insertion hole 275 is smaller than the tip end portion 274a. That is, C>B . . . (Expression 7) holds. This is because it becomes difficult for the insertion protrusion 274 to come off from the insertion hole 275 while the cover portion 272 is in a stable state.

As described above, the electronic equipment according to Embodiment 3 of the present invention includes the flexible printed circuit 277, and the flexible printed circuit 277 includes the main body portion 270 having the connection portion 276 to which an electronic component or another flexible printed circuit is connected electrically, an insertion hole 275 provided in the main body portion 270, and a cover portion 272 formed as part of the main body portion 270 and disposed so as to be bent at the bent portion 273 and to cover the connection portion 276. Then, the cover portion 272 includes the insertion protrusion 274 in at least one portion, and the insertion protrusion 274 is inserted in the insertion hole 275, whereby the cover portion 272 is anchored to the main body portion 270 at the insertion protrusion 274.

Consequently, the cover portion 272 can be anchored without using another member.

The oblique side of the insertion hole 275 is an example of a first opening of the present invention, and the base of the insertion hole 275 is an example of a second opening of the present invention.

Furthermore, as shown in Embodiment 3 of the present invention, the tip end portion 274a may be larger than the root portion 274b, and the insertion hole 275 may have a first opening whose width is equal to or larger than that of the tip end portion 274a, and a second opening that is smaller than the first opening and larger than the root portion 274b. In this case, the cover portion 272 is placed so that the root portion 274b is accommodated in the second opening while the cover portion 272 covers the connection portion 276.

Consequently, the insertion protrusion 274 can be inserted from the first opening whose width is equal to or larger than that of the tip end portion 274a, insertion is facilitated. Furthermore, since the root portion 274b is accommodated in the second opening 274b that is smaller than the first opening and larger than the root portion 274b, it becomes difficult for the insertion protrusion 274 to come off, and the cover portion 272 can be placed stably.

Furthermore, as shown in Embodiment 3 of the present invention, the directions of the insertion protrusion 274 may be varied between the state in which the insertion protrusion 274 is inserted in the first opening and the state in which the root portion 274b is accommodated in the second opening.

Thus, the insertion direction is different from the direction in which the insertion protrusion 274 is directed in an ordinary state, so that it becomes difficult for the insertion protrusion 274 to come off.

Furthermore, as shown in Embodiment 3 of the present invention, the insertion hole 275 has a triangular shape, and one side of the triangular shape may be the first opening and one of the other sides of the triangular shape may be the second opening. Consequently, a hole that makes it difficult for the insertion protrusion 274 to come off can be formed with a simple shape.

Furthermore, as shown in Embodiment 3 of the present invention, the tip end portion 274a may have a taper shape. This makes it easy for the insertion protrusion 274 to be inserted in the insertion hole 275.

In Embodiment 3 of the present invention, although the insertion hole 275 has a triangular shape, the present invention is not limited thereto. For example, as shown in FIG. 17, the insertion hole 275 may be a rectangular hole. Herein, as shown in FIG. 17A, when the width of the insertion hole 275 is set to be larger than that of the tip end portion 274a, the insertion protrusion 274 can be inserted in the insertion hole 275 easily. On the other hand, as shown in FIG. 17B, when the width of the insertion hole 275 is set to be smaller than that of the tip end portion 274a, although it becomes difficult for the insertion protrusion 274 to be inserted in the insertion hole 275, it becomes difficult for the insertion protrusion 274 to come off from the insertion hole 275 after the insertion. In this case, the rectangular hole does not have the first opening whose width is equal to or larger than the tip end of a protrusion and the second opening that is smaller than the first opening and larger than the root of the protrusion; therefore, the effect that it is difficult for the insertion protrusion 274 to come off from the insertion hole 275 as in Embodiment 3 is decreased.

Furthermore, as shown in FIG. 18, the insertion hole 275 may have a first opening 275a whose width is equal to or larger than that of the tip end of a protrusion and a second opening 275b that is smaller than the first opening 275a and larger than the root of the protrusion. In this case, the direction in which the protrusion is directed is the same between the state in which the protrusion is inserted in the first opening 275a and the state in which the root of the protrusion is accommodated in the second opening 275b. Therefore, this configuration is inferior to Embodiment 3 of the present invention since it is more difficult for the protrusion to come off from the hole in Embodiment 3.

The present invention is useful in a device that transmits electric signals using at least a flexible printed circuit, and is particularly useful in devices in which miniaturization is desirable.

[Note 1]

The flexible printed circuit according to the present invention is anchored to a holding member disposed within electronic equipment, and includes: a main body portion that includes electrical lines; a connection portion which is disposed in the main body portion and to which an electric component or another flexible printed circuit is connected; and a cover portion formed as part of the main body portion and disposed so as to cover the connection portion, wherein part of the cover portion is held by the holding member.

According to this configuration, an insulated state can be reliably maintained by using a configuration in which soldered connection portions are covered by part of the FPC and the covering portion is held by a holding member.

Note that the lens holder 6 and the metal plate 61 are examples of the holding member. The main body portion 70 is an example of the main body portion. Furthermore, the first connection portion 71 and the second connection portion 74 are examples of the connection portion. Finally, the first cover portion 72, the second cover portion 75, and the third cover portion 78 are examples of the cover portion.

[Note 2]

The flexible printed circuit according to the present invention can be configured so that part of the cover portion is anchored to the holding member by a screw.

According to this configuration, the cover portion can be securely anchored to the holding member.

[Note 3]

The flexible printed circuit according to the present invention can be configured so that the cover portion is configured of a plurality of cover portions; and at least one cover portion of the plurality of cover portions holds another cover portion of the plurality of cover portions, and is held by the holding member.

According to this configuration, the number of cover portions held by the holding member can be reduced to the lowest possible limit, and thus the ease of assembly can be improved.

[Note 4]

The image pickup device according to the present invention includes at least one lens, and includes: a lens holder that holds the lens; and a flexible printed circuit disposed at the lens holder. Here, the flexible printed circuit includes: a main body portion that includes electrical lines; a connection portion which is disposed in the main body portion and to which an electric component or another flexible printed circuit is electrically connected; and a cover portion formed as part of the main body portion and disposed so as to cover the connection portion, wherein part of the cover portion is held by the lens holder.

According to this configuration, an insulated state can be reliably maintained by using a configuration in which soldered connection portions are covered by part of the FPC and the covering portion is held by a holding member.

[Note 5]

The image pickup device according to the present invention can be configured so as to further include a plate member disposed on a surface opposite to a surface on which the lens is placed in the lens holder, wherein part of the cover portion is held between the plate member and the lens holder.

According to this configuration, the cover portion can be easily held, and thus the ease of assembly can be improved.

Note that the metal plate 61 is an example of the plate member.

[Note 6]

The image pickup device according to the present invention may be configured so that part of the cover portion is anchored to the lens holder by a screw.

According to this configuration, the cover portion can be securely anchored to the lens holder, and will not become detached easily.

[Note 7]

The image pickup device according to the present invention can be configured so that the cover portion is configured of a plurality of cover portions; and at least one cover portion of the plurality of cover portions holds another cover portion of the plurality of cover portions, and is held by the holding member.

According to this configuration, the number of cover portions held by the holding member can be reduced to the lowest possible limit, and thus the ease of assembly can be improved.

[Note 8]

The image pickup device according to the present invention may be configured so that the cover portion further includes a hole; the lens holder further includes a claw portion; and the cover portion is held by the lens holder by coupling the claw portion with the hole.

According to this configuration, the cover portion can be easily held, and thus the ease of assembly can be improved.

[Note 9]

The image pickup device according to the present invention may be configured so that the cover portion further includes an insertion portion; the main body portion further includes a hole; and the cover portion is held by the main body portion by inserting the insertion portion into the hole.

According to this configuration, the plate member, the screw, and the hole portion are unnecessary, and thus the cost is not increased.

[Note 10]

The electronic equipment according to the present invention includes a flexible printed circuit, wherein the flexible printed circuit includes a main body portion having a connection portion to which an electronic component or another flexible printed circuit is connected electrically, a hole provided in the main body portion, and a cover portion formed as part of the main body portion and disposed so as to be bent at a bent portion and to cover the connection portion, and the cover portion includes a protrusion in at least one portion, and is anchored to the main body portion at the protrusion when the protrusion is inserted in the hole.

Consequently, the cover portion is anchored to the main body portion in the flexible printed circuit, so that the cover portion can be anchored without using another member for anchoring the cover portion.

[Note 11]

In the electronic equipment according to the present invention, a tip end of the protrusion has a width larger than that of a root thereof, the hole has a first opening whose width is equal to or larger than that of the tip end of the protrusion and a second opening that is smaller than the first opening and larger than the root of the protrusion, and the cover portion is placed so that the root of the protrusion is accommodated in the second opening while the cover portion covers the connection portion.

Consequently, the cover portion is placed so that the protrusion portion is inserted through the first opening and the root is accommodated in the second opening. Therefore, the protrusion can be inserted in the hole easily, while it becomes difficult for the protrusion to come off from the hole.

[Note 12]

In the electronic equipment of the present invention, a direction in which the protrusion is directed can be varied between the state in which the protrusion is inserted in the first opening and the state in which the root of the protrusion is accommodated in the second opening.

Consequently, it becomes difficult for the protrusion to come off from hole while the root of the protrusion is accommodated in the second opening.

[Note 13]

In the electronic equipment of the present invention, the hole has a triangular shape, and one side of the triangular shape can be the first opening and one of the other sides of the triangular shape can be the second opening.

Consequently, a hole that makes it difficult for the protrusion to come off can be formed with a simple shape.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A flexible printed circuit adapted to be anchored to a holding member disposed within electronic equipment, the flexible printed circuit comprising:
    a main body portion that includes electrical lines;
    a connection portion formed by part of the electrical lines included in the main body portion that are exposed for electrical connection; and
    a cover portion formed as part of the main body portion, having a bending portion, a first surface that faces the connection portion when the cover portion is folded at the bending portion to cover the connection portion and a second surface opposite the first surface, a space between the first and second surfaces of the cover portion being electrically insulating,
    wherein part of the cover portion is adapted to be held by the holding member.

2. The flexible printed circuit according to claim 1, wherein part of the cover portion is adapted to be anchored to the holding member by a screw.

3. The flexible printed circuit according to claim 1,
    wherein the cover portion is configured of a plurality of cover portions; and
    at least one cover portion of the plurality of cover portions is adapted to hold another cover portion of the plurality of cover portions, and be held by the holding member.

4. Electronic equipment comprising a flexible printed circuit,
wherein the flexible printed circuit includes:
a main body portion having a connection portion formed by part of electrical lines included in the main body portion that are exposed for electrical connection;
a hole provided in the main body portion; and
a cover portion formed as part of the main body portion, having a bending portion, a first surface that faces the connection portion when the cover portion is folded at the bending portion to cover the connection portion, and a second surface opposite the first surface, a space between the first and second surfaces of the cover portion being electrically insulating, and
the cover portion includes a protrusion in at least one portion, and the cover portion is anchored to the main body portion at the protrusion when the protrusion is inserted in the hole.

5. The electronic equipment according to claim 4, wherein a tip end of the protrusion has a width larger than that of a root thereof,
the hole is defined by a first dimension whose width is equal to or larger than that of the tip end of the protrusion and a second dimension that is smaller than the first dimension and larger than the root of the protrusion, and
the cover portion is placed so that the root of the protrusion is accommodated in the second dimension while the cover portion covers the connection portion.

6. The electronic equipment according to claim 5, wherein a direction in which the protrusion is directed is varied between a state in which the protrusion is inserted in the first dimension and a state in which the root of the protrusion is accommodated in the second dimension.

7. The electronic equipment according to claim 6, wherein the hole has a triangular shape, and
one side of the triangular shape is the first dimension and one of the other sides of the triangular shape is the second dimension.

* * * * *